United States Patent
Wang et al.

(10) Patent No.: US 12,137,519 B2
(45) Date of Patent: Nov. 5, 2024

(54) PLANAR LIGHTWAVE CIRCUIT STRUCTURE BASED ON PRINTED CIRCUIT BOARD AND MANUFACTURING METHOD THEREOF

(71) Applicant: SOOCHOW UNIVERSITY, Suzhou (CN)

(72) Inventors: Mingdi Wang, Suzhou (CN); Zilin Tang, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 219 days.

(21) Appl. No.: 17/899,169

(22) Filed: Aug. 30, 2022

(65) Prior Publication Data

US 2023/0240003 A1    Jul. 27, 2023

(30) Foreign Application Priority Data

Jan. 27, 2022    (CN) .......................... 202210099574.3

(51) Int. Cl.
| | | |
|---|---|---|
| H05K 1/02 | (2006.01) | |
| G02B 6/122 | (2006.01) | |
| G02B 6/138 | (2006.01) | |
| G02B 6/12 | (2006.01) | |

(Continued)

(52) U.S. Cl.
CPC ........... *H05K 1/0274* (2013.01); *G02B 6/122* (2013.01); *G02B 6/138* (2013.01); *G02B 2006/12169* (2013.01); *H05K 3/14* (2013.01); *H05K 3/243* (2013.01)

(58) Field of Classification Search
CPC ........ H05K 1/0274; G02B 6/13; G02B 6/132; G02B 6/138
See application file for complete search history.

(56) References Cited

U.S. PATENT DOCUMENTS

| | | | |
|---|---|---|---|
| 2010/0021652 A1* | 1/2010 | Lin ........................ | H05K 3/185 427/552 |
| 2020/0346967 A1* | 11/2020 | Brusberg .............. | C03C 4/0092 |
| 2021/0247568 A1* | 8/2021 | Shi ....................... | H05K 1/0274 |

OTHER PUBLICATIONS

First Office Action in Chinese application 202210099574 with English translation, dated Apr. 27, 2023. (Year: 2023).*

(Continued)

*Primary Examiner* — Michael Stahl
(74) *Attorney, Agent, or Firm* — Hemisphere Law, PLLC; Zhigang Ma

(57) ABSTRACT

A planar lightwave circuit structure based on a printed circuit board and its manufacturing method are provided. The manufacturing method includes: S1, preparing the printed circuit board; S2, adhering the lower cladding layer to one side of the printed circuit board, and then annealing process carried out; S3, jetting a lightwave circuit material on an upper surface of the lower cladding layer in a predetermined route through an electrohydrodynamic jet printing device to form lightwave circuit lines to be cured, the lightwave circuit material being a slurry containing silver ions and an ultraviolet (UV) curing agent; S4, curing the lightwave circuit lines through irradiation of UV light, the UV light irradiating onto the lightwave circuit lines through a lens assembly with slits; and S5, depositing an upper cladding layer on the lower cladding layer and the lightwave circuit lines, and then solidifying treatment carried out.

10 Claims, 1 Drawing Sheet

(51) Int. Cl.
  *H05K 3/14*     (2006.01)
  *H05K 3/24*     (2006.01)

(56) References Cited

OTHER PUBLICATIONS

E. Sutanto et al. Electrohydrodynamic jet printing of micro-optical devices. Manufacturing Letters, 2:2:4-7, Jan. 2014 (https://doi.org/10.1016/j.mfglet.2013.10.007) (Year: 2014).*

* cited by examiner

PLANAR LIGHTWAVE CIRCUIT STRUCTURE BASED ON PRINTED CIRCUIT BOARD AND MANUFACTURING METHOD THEREOF

TECHNICAL FIELD

The invention relates to manufacturing technologies of printed circuit boards (PCBs), integrated circuits or integrated optical circuits, in particularly to a planar lightwave circuit (PLC) structure based on a printed circuit board and a manufacturing method thereof.

BACKGROUND

With the increasing demand for high-speed data transmission, higher requirements are put forward for interconnection rate, bandwidth and channel density between printed circuit boards and/or chips on a printed circuit board within a system. Due to inherent physical characteristics of metal wires, a traditional electrical interconnection based on metal wires between chips on a printed circuit board encounters a series of bottleneck problems such as serious transmission loss, limited transmission distance and serious crosstalk in a process of high-speed data transmission, which makes the electrical interconnection be unable to meet needs of high-speed information processing and transmission. Compared with the traditional electrical interconnection technology, an optical interconnection technology uses lightwave as a carrier of information transmission, which has advantages of high spatio-temporal bandwidth product, high integration density, wavelength division multiplexing compatible, anti-electromagnetic interference and low transmission loss. It is of great significance and application value to develop a kind of electro-optical hybrid printed circuit board for promoting developments of future data centers and high-performance computers by combining the optical interconnection technology with the electrical interconnection technology.

Generally, a structure employing the optical interconnection technology is referred to as an optical waveguide. The optical waveguide is a guiding medium device which is composed of optically transparent media and guides the propagation of lightwave therein. A transmission principle of the optical waveguide is that: a total reflection of electromagnetic wave on interfaces of media with different refractive indexes makes the lightwave confined inside the waveguide and its surrounding limited area. Common optical waveguides include optical fibers, planar lightwave circuits, ribbon optical waveguides, and the like. A structure of the planar lightwave circuit is flat plate shaped, and can use a printed circuit board as a substrate to realize fusion of an integrated optical circuit and an integrated circuit and thereby improve the signal transmission efficiency.

At present, a main manufacturing method of a core layer of the planar lightwave circuit in mass production is screen-printing. In particular, a screen is used as a template base, a screen printing template with patterns is manufactured by a photosensitive template making method, and printing is then carried out by using a basic principle that meshes in a patterned part of the screen printing template can pass through a material while meshes in a non-patterned part cannot pass through the material. During the printing, a lightwave circuit material is introduced onto one end of the screen-printing template, a scraper is used to apply a certain pressure to the lightwave circuit material on the screen-printing template, and meanwhile, the other end of the screen-printing template moves at a constant speed, so that the lightwave circuit material during movement is extruded onto a lower cladding material from the meshes in the patterned part via the scraper. Main disadvantages of the above screen-printing are: (1) the printing accuracy is low, and a printed line width is basically maintained at about 30 micrometers (μm); and (2) the cost of small-batch production is high, and the screen-printing template needs to be redesigned every time the designed lightwave circuit line is changed, so that the production is not flexible enough.

To sum up, there is a lack of technology suitable for small-batch production of electro-optical hybrid printed circuit boards, which can effectively control the cost while improving the printing accuracy.

SUMMARY

In view of the problems in the related art, a purpose of the invention is to provide a planar lightwave circuit based on a printed circuit board suitable for small-batch production and a manufacturing method thereof.

In order to achieve the purpose, embodiments of the invention provide technical solutions as follows.

A manufacturing method of a planar lightwave circuit structure based on a printed circuit board, includes:

S1, preparing the printed circuit board;

S2, adhering a lower cladding layer to one side of the printed circuit board and then annealing treatment carried out;

S3, jetting a lightwave circuit material on an upper surface of the lower cladding layer in a predetermined route through an electrohydrodynamic jet printing device to form lightwave circuit lines to be cured, wherein the lightwave circuit material is a slurry containing silver ions and an ultraviolet (UV) curing agent;

S4, curing the lightwave circuit lines through irradiation of UV light, wherein the UV light irradiates onto the lightwave circuit lines through a lens assembly with slits, and projection shapes of the UV light are the same as shapes of the lightwave circuit lines, and the UV light does not irradiate to the lower cladding layer; and S5, depositing an upper cladding layer on the lower cladding layer and the lightwave circuit lines, and then solidifying treatment carried out.

In a preferred embodiment, on the upper surface of the lower cladding layer, a projection of each of the lightwave circuit lines is located inside a projection of a corresponding one of the slits; the lens assembly further comprises a convex lens for converging the UV light, and the convex lens is arranged between the slits and the lightwave circuit lines.

In a preferred embodiment, the electrohydrodynamic jet printing device includes a nozzle and a working platform, the nozzle jets the lightwave circuit material, and the printed circuit board is placed on the working platform; in the S3, firstly forming a first electric field and then forming a second electric field between the nozzle and the working platform; the first electric field and the second electric filed both are perpendicular to the upper surface of the lower cladding layer, and the first electric field and the second electric filed have opposite directions.

In a preferred embodiment, an opening diameter of the nozzle is in a range of 0.5 μm to 2 μm.

In a preferred embodiment, in the S3, the nozzle moves above the lower cladding layer in at least one of a X direction and a Y direction; the X direction and the Y direction are intersected with each other and both parallel to the upper surface of the lower cladding layer.

In a preferred embodiment, in the S4, the lightwave circuit lines are kept at 180 degrees Celsius to 200 degrees Celsius for 20 minutes to 40 minutes while being irradiated with the UV light.

In a preferred embodiment, in the S2, the lower cladding layer is adhered onto the printed circuit board through adhesive, and the lower cladding layer is performed with the annealing treatment at 180 degrees Celsius to 220 degrees Celsius.

In a preferred embodiment, the lightwave circuit material further includes anions $R^-$; and in the S4, the lightwave circuit lines under the irradiation of UV light react as follows: $Ag^+ + R^- \rightarrow Ag\downarrow + R\uparrow$.

In a preferred embodiment, in the S5, the upper cladding layer is deposited through chemical vapor deposition.

In a preferred embodiment, after the S5, the manufacturing method further includes performing surface treatment and solder mask treatment on the printed circuit board, and the surface treatment is one selected from the group consisting of nickel-gold electroplating, hard-gold electroplating, nickel-palladium-gold electroless plating, gold deposition, tin deposition and silver deposition In a preferred embodiment, in the S1, n layers of the printed circuit board are prepared to form a multi-layer printed circuit board, where n≥2, and the lower cladding layer is adhered on an outermost one of the n layers of printed circuit circuits.

An embodiment of the invention further provides a planar lightwave circuit structure obtained by the manufacturing method of any one of above embodiments.

In a preferred embodiment, a width of each the lightwave circuit line is in a range of 4 µm to 6 µm.

In a preferred embodiment, a refractive index of the lower cladding layer is n1, a refractive index of each the lightwave circuit line is n2, n1=1.3-1.5, and n2−n1=0.02−0.1.

Due to the proposal of the above technical solutions, the planar lightwave circuit structure based on a printed circuit board provided by embodiments of the invention takes the printed circuit board as a substrate, can realize the fusion of an integrated optical circuit and an integrated circuit, make the integrated lines develop towards the direction of miniaturization, improve the wiring density, better realize the electro-optical parallel interconnection, and ensure the integrity of transmitted signals to the maximum extent, and reduce the geometric size and power consumption of the device.

According to the manufacturing methods of the lightwave circuit structure provided by the embodiments of the invention, the electrohydrodynamic jet printing device is employed, and the electric field acting force is used to directly jet the predetermined lightwave circuit lines on the lower cladding layer. Compared with the traditional air pressure jetting method, the electric field jetting method can directly prepare a finer and more accurate pattern circuit, and a minimum line width can reach 4 µm, so that higher printing precision and product performance can be obtained, and moreover, cost and difficulty of subsequent photocuring can be reduced. In addition, the nozzle of the electrohydrodynamic jet printing device can move freely, the jetting route and the line width can be flexibly changed according to design requirements, without preparing screen-printing plates for different patterns each time, so that the cost can be greatly reduced. Furthermore, in the curing process of the lightwave circuit lines, the jetted lightwave circuit material is the final required lightwave circuit lines, so that a mask is not required to be additionally manufactured, and the waste of the lightwave circuit material is effectively reduced. The use of the high-precision lens assembly can ensure that the ultraviolet light can accurately irradiate onto the lightwave circuit lines to be cured, the lower cladding material would not be damaged by the irradiation of redundant ultraviolet light, the production efficiency and the product quality can be improved, and thus the method is particularly suitable for the production of small-batch electro-optical hybrid printed circuit boards.

BRIEF DESCRIPTION OF THE DRAWINGS

In order to illustrate technical solutions in embodiments of the invention more clearly, drawings used in the embodiments will be briefly introduced below.

Figure 1:
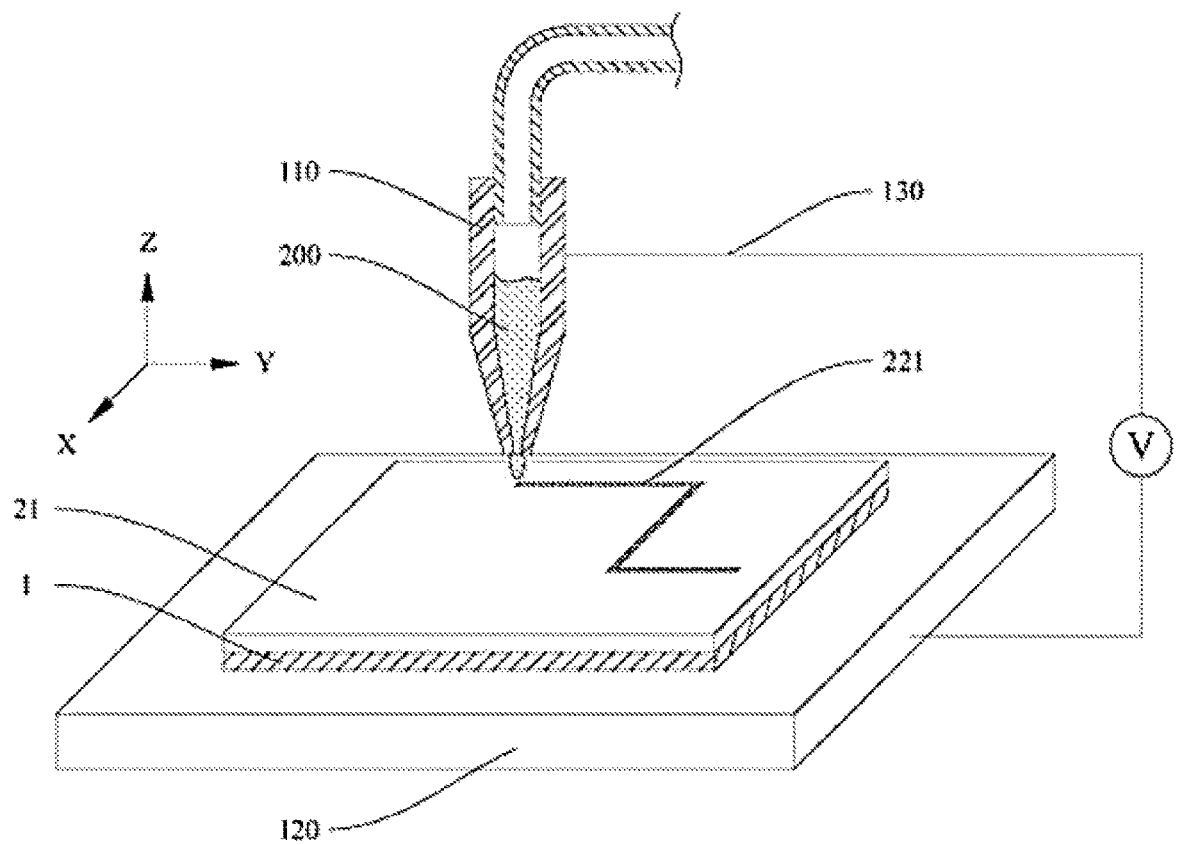
FIG. 1 illustrates a schematic view associated with a step S3 of an illustrative embodiment of the invention.

Description of reference numerals: 110, nozzle; 120, working platform; 130, circuitry; 200, lightwave circuit material; 1, printed circuit board; 11, first wiring layer; 12, dielectric layer; 121, via hole; 13, second wiring layer; 14, solder mask layer; 15, surface treatment layer; 21, lower cladding layer; 22, core layer; 221, lightwave circuit line; 23, upper cladding layer.

DETAILED DESCRIPTION OF EMBODIMENTS

Preferred embodiments of the invention will be described in detail below in conjunction with the accompanying drawings, so that advantages and features of the invention will be more readily understood by those skilled in the art.

In the description of the invention, it should be noted that an orientations or a positional relationship indicated by terms such as "upper", "lower", "left", "right", "vertical", "horizontal", "inner", "outer", "left-right direction", "height-wise direction" or "front-rear direction", is based on the orientation or positional relationship shown in FIG. 1, which is only for the convenience of describing the invention and simplifying the description, rather than indicating or implying a device or an element referred to must have a particular orientation, has only the particular orientation, and is constructed and operate in the particular orientation, and therefore, should not be construed as limiting the invention.

Figure 2:
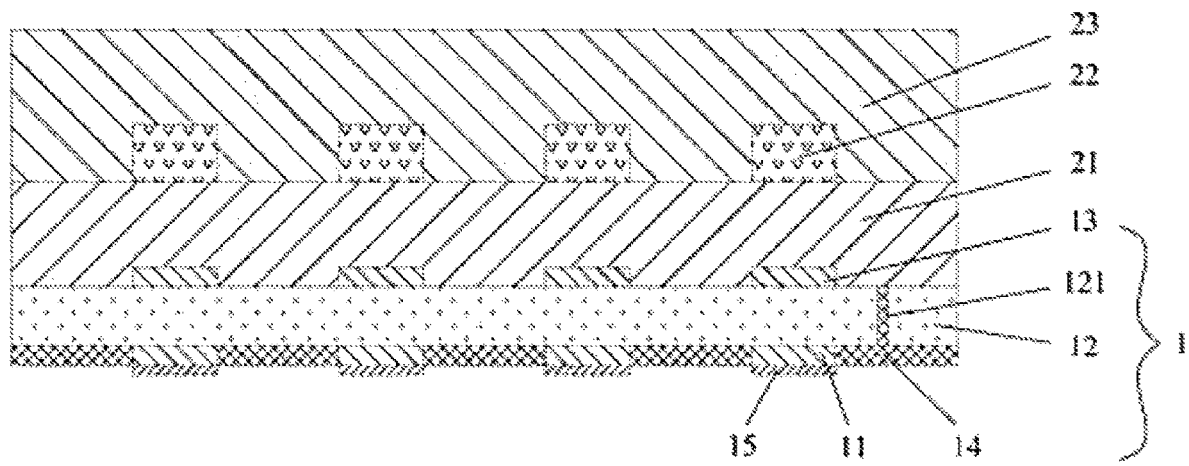
FIG. 2 illustrates a schematic cross-sectional view of a planar lightwave circuit structure based on a printed circuit board according to an embodiment of the invention.

As illustrated in FIG. 2, a planar lightwave circuit structure based on a printed circuit board according to an embodiment of the invention may include the printed circuit board 1 and a planar lightwave circuit disposed on the printed circuit board 1. The planar lightwave circuit structure can realize electro-optical parallel interconnection and significantly improve efficiency and integrity of data transmission.

In an illustrated embodiment, the single-layer printed circuit board 1 is taken as an example. In other embodiments, according to actual requirements, in order to achieve higher data transmission rate, two or more the printed circuit boards 1 can be stacked together to form a multi-layer printed circuit board. Specifically, the single-layer printed circuit board 1 may include a first wiring layer 11, a dielectric layer 12 and a second wiring layer 13 sequentially arranged from bottom to top. The dielectric layer 12 is made of an epoxy resin. The first wiring layer 11 and the second wiring layer 13 are made of metal wires. The dielectric layer 12 is further formed with a via hole 121 for connecting the first wiring layer 11 with the second wiring layer 13. A solder mask layer 14 and a surface treatment layer 15 are further provided at the bottom of the printed circuit board 1.

A lower cladding layer 21, a core layer 22 and an upper cladding layer 23 are sequentially disposed from bottom to top on the printed circuit board 1. The lower cladding layer 21 and the upper cladding layer 23 each are made of silicon dioxide or other transparent material. Each of the lower cladding layer 21 and the upper cladding layer 23 has a refractive index n1 of about 1.457, and a thickness in a range of 10 μm to 15 μm. The core layer 22 is composed of multiple (i.e., more than one) lightwave circuit lines 221. A refractive index n2 of each of the lightwave circuit lines is greater than the refractive index n1 by 0.02 to 0.1, so that the lightwave can be confined to propagate in the lightwave circuit lines 221 and their surrounding limited areas. A line width of each of the lightwave circuit lines 221 may be as low as 4 μm, and thus high printing accuracy and wiring density can be achieved, so that a geometric size of the planar lightwave circuit structure can be greatly reduced under the same number of wirings.

As illustrated in FIG. 1, a manufacturing method of a planar lightwave circuit structure based on a printed circuit board according to an embodiment of the invention may include steps S1~S6 as follows.

S1, preparing a single-layer or multi-layer printed circuit board 1, each layer of printed circuit board 1 including a first wiring layer 11, a dielectric layer 12 and a second wiring layer 13 sequentially arranged from bottom to top, and placing the prepared printed circuit board 1 on a horizontal working platform 120.

S2, performing preprocessings such as fine grinding, cleaning and blow-drying on a lower cladding material (herein, silicon dioxide), then adhering the lower cladding material to one side of the printed circuit board 1 through adhesive, and then annealing treatment carried out on the lower cladding material at about 200 Celsius degrees to eliminate the residual stress to thereby obtain a lower cladding layer 21.

S3, jetting a lightwave circuit material 200 on an upper surface of the lower cladding layer 21 in a predetermined route through an electrohydrodynamic jet printing device to form lightwave circuit lines 221 to be cured. The lightwave circuit material 200 is a slurry containing silver ions, anions R⁻ and a UV (ultraviolet) curing agent.

S4, curing the lightwave circuit lines 221 by irradiation of ultraviolet light. The ultraviolet light irradiates onto the lightwave circuit lines 221 through a lens assembly with slits (not shown in the drawings), and the lightwave circuit lines 221 may be kept at a temperature in a range of 180 to 200 degrees Celsius for about 30 minutes to enhance adhesion capability of the lightwave circuit material 200 to thereby obtain a core layer 22.

S5, depositing a layer of silicon dioxide on both the lower cladding layer 21 and the core layer 22 through a chemical vapor deposition method as an upper cladding layer 23, and then annealing and curing treatment carried out to make the silicon dioxide of the upper cladding layer 23 become dense and uniform.

S6, performing surface treatment and solder mask treatment on the printed circuit board 1 to obtain a resultant planar lightwave circuit structure based on the printed circuit board 1. The surface treatment can be any one of nickel-gold electroplating, hard-gold electroplating, nickel-palladium-gold electroless plating, gold deposition, tin deposition and silver deposition.

For the material growths and annealing hardening processes of the lower cladding layer 21 and the upper cladding layer 23, in order to make the thickness and the refractive index of each layer uniform and accurate to meet designed structural parameters, the residual stress in the material needs to be reduced as much as possible, so as to reduce a birefringence effect of the planar lightwave circuit structure.

Moreover, the electrohydrodynamic jet printing device may include a nozzle 110 and the working platform 120. The nozzle 110 and the working platform 120 are connected to each other through a circuitry 130, so that an electric field can be formed between the nozzle 110 and the working platform 120 after being energized.

The nozzle 110 is movably disposed on the working platform 120 and movable in both the X direction and the Y direction. The X direction and the Y direction are perpendicular to each other and both are horizontal directions. In some embodiments, the nozzle 110 is also capable of being fine-tuned in the vertical Z direction to precisely control a distance of the nozzle 110 from an upper surface of the lower cladding layer 21.

In an illustrated embodiment, an opening diameter of the nozzle 110 is about 1 μm, and the electrohydrodynamic jet printing device delivers the lightwave circuit material 200 into the nozzle 110. Under the action of the electric field, the lightwave circuit material 200 is ionized into anions and cations, and then jetted onto the lower cladding layer 21 under actions of corresponding electric field forces. The electrohydrodynamic jet printing device may further include a control system (not shown) for controlling a movement path of the nozzle 110 and direction and intensity of the electric field.

In an embodiment, in the step S3, between the nozzle 110 and the working platform 120, a first electric field is firstly formed and then a second electric field is formed. The first electric field and the second electric field are both perpendicular to the upper surface of the lower cladding layer 21, and have opposite directions. Thus, after one round of electric field reversal, the nozzle 110 can jet the anions and cations to form fine lightwave circuit lines 221.

Meanwhile, in the step S3, the control system controls the nozzle 110 to move in the X direction and/or the Y direction above the lower cladding layer 21 according to a predetermined pattern/route, so as to jet in a predetermined route to form the designed lightwave circuit lines 221.

In this way, when planar lightwave circuit structures with different lightwave circuit lines 221 are manufactured by using the manufacturing method of the illustrated embodiment of the invention, the lightwave circuit lines 221 can be directly printed only by changing predetermined patterns in the control system, tools such as the screen-printing template do not need to be additionally configured, thereby greatly reducing the production cost and the process complexity.

In an illustrated embodiment, shapes of the slits in the lens assembly are the same as that of the lightwave circuit lines 221. On the upper surface of the lower cladding layer 21, projections of the lightwave circuit lines 221 are located inside projections of the corresponding slits respectively, that is, a width of the slit is slightly larger than a width of the corresponding lightwave circuit line 221. The lens assembly may further include a convex lens for converging the ultraviolet light, and the convex lens is positioned between the slits and the lightwave circuit lines. Thus, in the step S4, the UV light transmitted through the slits and the convex lens, can just irradiate onto the lightwave circuit lines 221 to be cured, and projected shapes of the UV light are completely corresponding to the respective shapes of the lightwave circuit lines 221 to precisely cure the lightwave circuit lines 221, without irradiating to the lower cladding layer 21 or other devices, thereby avoiding damage caused by too strong UV light, which would affect the performance of the planar lightwave circuit structure.

In an embodiment, in the step S4, the lightwave circuit lines 221 under UV irradiation react as follows: $Ag^++R^-\rightarrow Ag\downarrow+R\uparrow$. Finally, microscale and nanoscale elemental silvers are fixed on the lower cladding layer 21 as a main transmission medium of the lightwave circuit.

In summary, the planar lightwave circuit structure based on a printed circuit board and the manufacturing method thereof provided in the embodiments of the invention can manufacture a planar lightwave circuit structure with high precision, the manufacturing method has high flexibility and is particularly suitable for the production of small-batch electro-optical hybrid printed circuit boards.

The above embodiments are only used to illustrate the technical concept and features of the invention, and are intended to enable those skilled in the art to understand the contents of the invention and implement it, and are not intended to limit the scope of protection of the invention. All equivalent changes or modifications made in accordance with the spirit of the invention shall be included in the scope of protection of the invention.

What is claimed is:

1. A manufacturing method of a planar lightwave circuit structure based on a printed circuit board, comprising:
    S1, preparing the printed circuit board;
    S2, adhering a lower cladding layer to one side of the printed circuit board, and then carrying out annealing treatment;
    S3, jetting a lightwave circuit material on an upper surface of the lower cladding layer in a predetermined route through an electrohydrodynamic jet printing device to form lightwave circuit lines to be cured, wherein the lightwave circuit material is a slurry containing silver ions and an ultraviolet (UV) curing agent;
    S4, curing the lightwave circuit lines through irradiation of UV light, wherein the UV light irradiates onto the lightwave circuit lines through a lens assembly with slits, and projection shapes of the UV light are the same as shapes of the lightwave circuit lines, and the UV light does not irradiate to the lower cladding layer; and
    S5, depositing an upper cladding layer on the lower cladding layer and the lightwave circuit lines, and then carrying out solidifying treatment.

2. The manufacturing method as claimed in claim 1, wherein on the upper surface of the lower cladding layer, a projection of each of the lightwave circuit lines is located inside a projection of a corresponding one of the slits; the lens assembly further comprises a convex lens for converging the UV light, and the convex lens is arranged between the slits and the lightwave circuit lines.

3. The manufacturing method as claimed in claim 1, wherein the electrohydrodynamic jet printing device comprises a nozzle and a working platform, the nozzle jets the lightwave circuit material, and the printed circuit board is placed on the working platform; in the S3, firstly forming a first electric field and then forming a second electric field between the nozzle and the working platform; the first electric field and the second electric field both are perpendicular to the upper surface of the lower cladding layer, and the first electric field and the second electric field have opposite directions.

4. The manufacturing method as claimed as claim 3, wherein an opening diameter of the nozzle is in a range of 0.5 μm to 2 μm.

5. The manufacturing method as claimed in claim 3, wherein in the S3, the nozzle moves above the lower cladding layer in at least one of a X direction and a Y direction; the X direction and the Y direction are intersected with each other and both parallel to the upper surface of the lower cladding layer.

6. The manufacturing method as claimed in claim 1, wherein in the S4, the lightwave circuit lines are kept at 180 degrees Celsius to 200 degrees Celsius for 20 minutes to 40 minutes while being irradiated with the UV light; and/or
    wherein in the S2, the lower cladding layer is adhered onto the printed circuit board through adhesive, and the annealing treatment is performed on the lower cladding layer at 180 degrees Celsius to 220 degrees Celsius.

7. The manufacturing method as claimed in claim 1, wherein the lightwave circuit material further comprises anions $R^-$; and in the S4, the lightwave circuit lines under the irradiation of UV light react as follows: $Ag^++R^-\rightarrow Ag\downarrow+R\uparrow$.

8. The manufacturing method as claimed in claim 1, wherein in the S5, the upper cladding layer is deposited through chemical vapor deposition; and/or
    wherein after the S5, the manufacturing method further comprises performing surface treatment and solder mask treatment on the printed circuit board, and the surface treatment is one selected from the group consisting of nickel-gold electroplating, hard-gold electroplating, nickel-palladium-gold electroless plating, gold deposition, tin deposition and silver deposition; and/or
    wherein in the S1, n layers of the printed circuit board are prepared to form a multi-layer printed circuit board, where n≥2, and the lower cladding layer is adhered on an outermost one of the n layers of printed circuit circuits.

9. A planar lightwave circuit structure obtained by the manufacturing method as claimed in claim 1.

10. The planar lightwave circuit structure as claimed in claim 9, wherein a width of each of the lightwave circuit lines is in a range of 4 μm to 6 μm; and/or
    wherein a refractive index of the lower cladding layer is n1, a refractive index of each of the lightwave circuit lines is n2, n1=1.3–1.5, and n2−n1=0.02–0.1.

* * * * *